SURFACE TREATMENT FOR SEMICONDUCTOR DEVICES

Filed March 3, 1965

INVENTOR
Shinkichi Okutsu
Noriyuki Nariai
BY Takeshi Takagi
Keijiro Uehara

H. Edward Mestern, Agt.

3,447,958
Patented June 3, 1969

3,447,958

SURFACE TREATMENT FOR SEMICONDUCTOR DEVICES

Shinkichi Okutsu and Noriyuki Nariai, Kodaira-shi, Takeshi Takagi, Musashino-shi, and Keijiro Uehara, Kita-ku, Tokyo-to, Japan, assignors to Kabushiki Kaisha Hitachi Seisakusho, Tokyo-to, Japan, a joint-stock company of Japan Filed Mar. 3, 1965, Ser. No. 436,748
Claims priority, application Japan, Mar. 6, 1964, 39/12,296
Int. Cl. H01b *1/02;* C23c *9/00, 11/06*
U.S. Cl. 117—201 7 Claims

ABSTRACT OF THE DISCLOSURE

A method for obtaining a silicon semiconductor device whose substrate surface is coated with a glass-like layer containing lead oxide by first vapor-depositing a lead layer on a silicon oxide film provided on the surface of the silicon substrate, then conducting a heat-treatment of the substrate for a required time in an oxidizing atmosphere of about 350° C. to completely oxidize the lead layer to lead oxide, thereafter subjecting the substrate to another heat-treatment in an oxidizing atmosphere of about 600° C. for a required time, thereby forming a solid-solution of lead oxide and silicon oxide.

Figure 1:
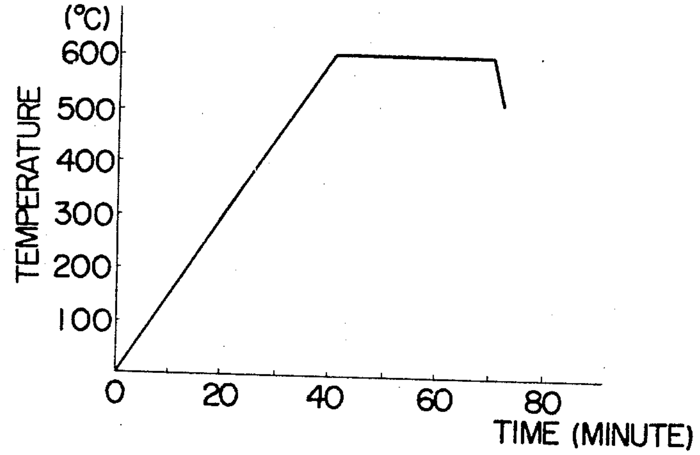
Figure 2A:
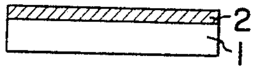
Figure 2B:
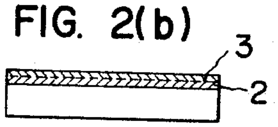
Figure 2C:
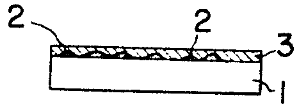
Figure 2D:
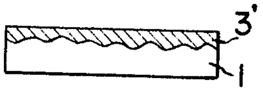

This invention relates to surface treatment for semiconductor devices, and more particularly it relates to a new method for forming insulating protective films on the surfaces of semiconductors such as silicon, germanium, and compound semiconductors.

It is a general practice to protect with an insulating covering the surfaces, particularly the exposed parts of pn junctions, of semiconductors of semiconductor devices such as transistors and diodes in order to increase their serviceable life and reliability and to reduce noise.

For this insulating covering, it is known to use a layer of silicon dioxide $SiO_2$ thermally grown from the surface of silicon Si. However, because the growing temperature for such a $SiO_2$ layer is a high temperature of from 1,000 to 1,200 degrees C., the active impurities which have been introduced into the Si substrate prior to this growth of $SiO_2$ layer rediffuse during the $SiO_2$ layer growth, and the position of each pn junction is displaced. Furthermore, since the substrate silicon becomes an oxide material, the junction face of the substrate and the $SiO_2$ layer is displaced as the oxidation progresses. This result imposes difficulties in the design of micron order semiconductor devices.

Furthermore, since the oxide layer is formed at the temperature at which diffusion of the active impurities occurs, and also the diffusion coefficients and segregation coefficients relative to the active impurities in the respective layers of the Si and $SiO_2$ differ, as a result, the impurity concentration of the semiconductor surface in the vicinity of the junction surface varies, and there arises a state whereby carrier accumulation, that is, the so-called enhancement mode, occurs, or a state whereby a lack of carrier, that is, the so-called depletion mode, occurs. This result causes the inversion, for example, of a p-type semiconductor surface covered by the $SiO_2$ layer into an n-type surface and is considered to be one cause of increase in the surface leakage current of semiconductor devices.

The deposition of $SiO_2$ on a semiconductor surface by pyrolytic decomposition of organo-oxysilane has also been proposed. For example, when tetraethoxysilane $Si(OC_2H_5)_4$ is introduced with $N_2$ gas as a carrier gas to the surface of a substrate to be coated and maintained at 725 degrees C. for 30 minutes, a $SiO_2$ film of approximately 4,000 angstroms is obtained. Since a $SiO_2$ film can be obtained at a relatively low temperature by this method, disadvantages such as the rediffusion of the impurities during the formation of the $SiO_2$ film and the displacement of the junction face of the $SiO_2$ layer and the semiconductor substrate are eliminated. However, the $SiO_2$ film so obtained heretofore has been porous and has not had sufficient effect in shielding the semiconductor surface from impurities and moisture contained in the atmosphere.

Furthermore, in general, $SiO_2$ has the tendency to affect the surface potential of a semiconductor surface converted thereby and to render the surface into one of n-type conductivity and is considered to be a cause of deterioration of the breakdown voltage of the element.

It is further known, e.g., from U.S. Patent 3,301,706, that when a semiconductor is heated in an atmosphere containing lead monoxide PbO, a glass-like substance consisting of the oxides of lead and the semiconductor is formed at a temperature in the range of approximately from 500 to 600 degrees C. This method, however, has been accompanied by difficulty in reproducibility because of the necessity of carrying out control of the quantity of PbO introduced to the semiconductor surface as the vapor pressure of the PbO contained in the carrier gas is measured.

Still another known method is that of depositing lead by evaporation on the semiconductor surface and oxidizing this semiconductor with deposited lead in an atmosphere containing oxygen, whereby the semiconductor oxidizes at a relatively low temperature, and, at the same time, a layer of a glass-like substance consisting of a solid solution of the oxides of the semiconductor and the lead is formed on the semiconductor surface. The resulting glass-like layer containing lead is highly effective in protecting the semiconductor surface from moisture and the external atmosphere and is highly desirable for stabilizing the semiconductor surface. However, it has not been possible by this method to produce with good reproducibility such glass-like films of uniformly good quality as mentioned above and as will be described hereinafter.

The present invention contemplates improvement in a method for surface treatment of semiconductors wherein, by depositing lead by evaporation on a semiconductor surface and heat treating the semiconductor in an oxidizing atmosphere, the semiconductor is oxidized, and, at the same time, a glass-like or vitreous layer consisting of a solid solution of the lead and the resulting oxide of the semiconductor is formed.

As will be described hereinafter, when lead is deposited by evaporation on a semiconductor surface, and then the semiconductor, in that state, is oxidized, the resulting glass-like film has poor evenness and non-uniform composition. Furthermore, unreacted lead remains in some cases and is considered to be a cause of deterioration of the characteristics of the element. We have succeeded in overcoming these difficulties by first oxidizing at a low temperature of approximately 350 degrees C. the lead which has been deposited by evaporation, thereby to convert the lead into PbO, and thereafter heating the element at a temperature of approximately 600 degrees C.

According to one embodiment of the present invention, there is provided a method which comprises depositing Pb by evaporation directly on the surface of a silicon substrate, maintaining the substrate in an oxidizing atmosphere at 350 degrees C. to cause the Pb to change completely into PbO, and thereafter raising the temperature to cause oxidation of the silicon and, at the same time, formation of a glass-like covering film consisting of a solid solution of Pb and the resulting oxide of silicon.

According to another embodiment of the invention, $SiO_2$ is deposited by decomposing tetraethoxysilane on a substrate of a semiconductor such as germanium or silicon, and thereafter a glass-like layer consisting of a solid solution of PbO is formed on the $SiO_2$ layer. This method is an improvement of the method proposed previously in U.S. patent application Ser. No. 386,017, filed on July 29, 1964, entitled "Surface Treatment for Semiconductors," which comprises depositing $SiO_2$ on a semiconductor surface, depositing Pb thereon, and thereafter heat treating the semiconductor in an oxidizing atmosphere to cause the Pb to change into PbO and, at the same time, to form a glass-like cover consisting of a solid solution of $SiO_2$ and PbO.

It is an object of the present invention to cover semiconductor surfaces, particularly exposed parts of pn junctions, with a glass-like covering film containing lead to shield such semiconductor surfaces from the effects of moisture and impurities contained in the surrounding atmosphere, and thereby to stabilize semiconductor devices and prolong their serviceable life.

Another object of the invention is to provide uniform and even, lead-glass films with good reproducibility.

Still another object is to provide glass films in which unreacted lead is not remaining.

A further object is to form protective, insulating films on semiconductor substrate surfaces at a low temperature of a value such that active impurities introduced beforehand into the semiconductor substrates do not rediffuse.

Figure 3:
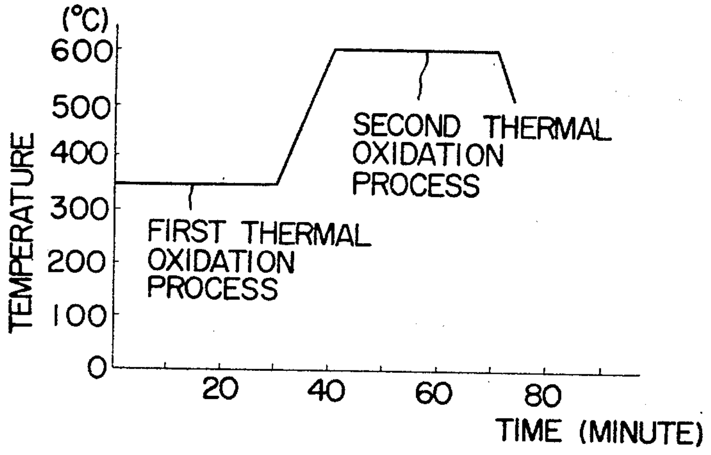

The nature, principle, and details of the invention, as well as the difficulties encountered in the prior art, will be more clearly apparent by reference to the following detailed description, when taken in conjunction with the accompanying illustrations in which like parts are designated by like reference characters, and in which:

FIG. 1 is a graphical time chart indicating a temperature schedule for forming a glass-like, protective film containing lead on a semiconductor surface;

FIG. 2 consists of sectional views (*a*), (*b*), (*c*), and (*d*) respectively showing progressive states of a glass film as it is formed according to the temperature schedule shown in FIG. 1;

FIG. 3 is a graphical time chart indicating a temperature schedule for the purpose of forming a glass-like, protective film containing lead on a semiconductor surface by the method according to the invention.

As conducive to a full appreciation of the nature and utility of the present invention, the following consideration of the prior art and the difficulties encountered therein is presented with respect to a conventional practice with reference to FIGS. 1 and 2.

First, a silicon semiconductor substrate is washed to clean its surface, and then, in a known vacuum evaporation apparatus, an evaporation deposited lead layer of a thickness of 1,000 angstroms is formed on the surface of the silicon substrate surface.

Next, the substrate is placed in a heating furnace containing an oxygen atmosphere and heat treated according to a temperature schedule as indicated in FIG. 1 whereby the temperature is raised at a rate of 15 degrees C. per minute to 600 degrees C., which is maintained for 30 minutes.

Although the exact details are not known, it may be considered that the following chemical reactions are caused by this heat treatment:

$$2Pb+O_2 \rightarrow 2PbO \quad \text{Eq. 1}$$
$$2PbO+Si \rightarrow SiO_2+2Pb \quad \text{Eq. 2}$$
$$PbO+SiO_2 \rightarrow SiO_2+PbO \quad \text{Eq. 3}$$

As indicated by Eq. 1, Pb first oxidizes to become PbO, and then, as indicated by Eq. 2, the PbO supplies oxygen to Si, which is thereby oxidized. That is, the Pb functions as an agent which supplies oxygen to the Si surface.

If the silicon surface is oxidized in an oxygen atmosphere without the use of Pb, the $SiO_2$ layer formed on the surface, because of its high bond energy between its atoms, will suppress diffusion of oxygen, and at a low temperature of the order of from 500 to 600 degrees C., the quantity of oxygen diffusing from the surrounding atmosphere through the $SiO_2$ layer and reaching the silicon surface will be small, whereby the oxidation speed will be low. In order to increase the oxidation speed, it is necessary, at normal atmospheric pressure, to raise the temperature to 1,000 or more degrees C. to weaken the bond between the atoms of the $SiO_2$ layer, and thereby to facilitate the diffusion of oxygen.

When Pb is used as a mediator, since the actual effect is to weaken the inter-atomic bond energy of the $SiO_2$ layer and to facilitate the diffusion of oxygen, the oxidation of the silicon substrate is promoted even at a relatively low temperature of the order of 600 degrees C. The resulting $SiO_2$ and the PbO react to form a glass-like substance.

By this conventional method, however, the time for the chemical action for the lead to become lead oxide with the lead remaining in its deposited even state is short because of the following reason. The temperature at which the chemical action for changing lead into lead monoxide is approximately 300 degrees or higher. On the other hand, as stated previously, the melting point of lead is 327.3 degrees C. When lead is heated above its melting point and changed into molten lead, the state of equilibrium between the adhesive force of the molten lead relative to the silicon semiconductor and the force of the surface tension of the molten lead is disrupted in the vicinity of 400 degrees C., the surface tension becoming greater. Consequently, the time for the lead, in its deposited state, that is, the state wherein coagulation of the lead does not occur, to change into lead monoxide is only of the order of approximately 6 minutes elapsing while the temperature rises from 300 to 400 degrees C. Accordingly, when the temperature rises above 400 degrees C., the molten lead which has not been oxidized into lead monoxide coagulates. Then, when the heat treatment is continued under these conditions, the coagulated lead is transformed in that form into lead monoxide, which reacts with $SiO_2$ to form a glass-like layer of $SiO_2 \cdot PbO$.

Since this layer consisting of a solid solution of $SiO_2$ and PbO is formed after the lead is transformed in its coagulated state into lead monoxide, it is extremely uneven and has a non-uniform composition. Furthermore, there is the possibility of the lead, upon coagulating, remaining in the unreacted state in the covering film. In the case when the coagulation is excessive, parts on the semiconductor surface at which an oxide film foes not form in actual effect are produced, and the protective function of the covering becomes deficient.

The above described phenomenon will be further considered in detail with reference to FIG. 2. First, up to about 20 minutes after the start of heating of the semiconductor element in an oxidizing atmosphere, the element is in a state wherein a lead layer 2 is merely deposited on the silicon semiconductor substrate 1 as shown in FIG. 2(*a*), and oxidation of the lead 2 does not occur. After the elapse of about 27 minutes, the lead 2 melts and, beginning from the surface part is gradually converted into lead monoxide 3 as indicated in FIG. 2(*b*), and the reaction according to the above stated Eq. 1 takes place. Then as the heat treatment progresses, and, after 40 minutes have elapsed, the molten lead 2 coagulates.

On one hand, oxidation of the lead by oxygen continually supplied into the furnace progresses, whereby the layer of lead oxide 3 reaches the surface part of the silicon semiconductor 1 as indicated in FIG. 2(*c*). Then, as the heat treatment is continued while oxygen is continually supplied, the chemical reaction according to Eq. 2 occurs between the lead monoxide 3 and the silicon semiconductor 1, which reaction is then followed by the reaction according to Eq. 3.

However, at the parts where the lead has coagulated, since the reactions indicated by Eqs. 2 and 3 occur after the coagulated lead has changed into lead monoxide, the time of reaction according to Eq. 3 at the surface part of the substrate 1 differs, and a lead glass-like film 3′ of the state indicated in FIG. 2(*d*) is formed. The resulting film is uneven and of non-uniform composition.

This phenomenon occurs similarly also in the case wherein an oxide film such as silicon dioxide is formed beforehand on the surface of a silicon semiconductor substrate on which Pb is deposited by evaporation. The reason for this is that the change in state of the lead deposited on the surface does not differ at all from that in the above described example, and the only difference is that the lead glass-like film is formed without the occurrence of the chemical reaction indicated by Eq. 2. In either case, the resulting lead glass-like film is very uneven and of non-uniform composition, and its protective function is deficient.

As mentioned hereinbefore, the present invention overcomes this difficulty by providing a method for surface treatment of semiconductors which comprises depositing lead directly on the surface of a semiconductor substrate or on a covering film consisting of an oxide such as silicon dioxide formed on the substrate surface, causing the lead to oxidize at a temperature lower than the temperature at which the molten lead coagulates, thereby to change the lead into lead monoxide, and thereafter raising the treatment temperature to cause the lead monoxide and the oxide to react to form a glass-like covering film.

In one preferred embodiment of the invention, a lead layer 2 is deposited to a thickness of 300 angstroms on the surface of a silicon semiconductor substrate 1 as shown in FIG. 2. Next, the substrate with the lead layer is placed in a heating furnace containing an oxidizing atmosphere maintained at a temperature of 350 degrees C. and is maintained at this temperature for 30 minutes (this treatment being hereinafter referred to as the "first thermal oxidation process") in accordance with the temperature schedule indicated in FIG. 3. The furnace temperature is then raised to 600 degrees C. at which temperature heat treatment is carried out for 30 minutes (this treatment being hereinafter referred to as the "second thermal oxidation process"). By this heat treatment consisting of two steps, a lead glass-like film of 2,200-angstrom thickness consisting of a colid solution of $SiO_2$ and PbO is formed on the surface of the silicon semiconductor 1.

This covering film is very even and, moreover, of uniform composition as indicated by the results of analyses we have carried out.

The thickness of the lead glass-like film can be controlled at will by varying the treatment temperature of the second thermal oxidation process or the quantity of lead deposited on the silicon semiconductor substrate surface. Examples of this control are indicated in the accompanying Table 1.

TABLE 1

| Deposited lead thickness (angstroms) | Glass film thickness (angstroms) produced by 2d thermal oxidation process temperature of— | | |
|---|---|---|---|
| | 500° C. | 600° C. | 700° C. |
| 300 | 1,900 | 2,200 | 2,600 |
| 700 | 2,400 | 3,100 | 4,400 |
| 1,000 | 2,600 | 3,800 | 5,000 |
| 1,300 | 3,300 | 4,300 | 6,800 |

NOTE.—The 2d thermal oxidation process time in each case was 30 min.

While in this example the case wherein the semiconductor substrate is silicon is described, the method may be applied also in the case of germanium. In the case of germanium, however, the film produced is inferior as a protective film to that in the case of silicon. The use of germanium for the substrate produces desirable results according to the method described hereinbelow.

First, a germanium semiconductor substrate having a clean surface is repared. On this surface, a $SiO_2$ layer is deposited by a method such as the aforementioned pyrolytic decomposition of an organo-oxysilane. Next, lead is deposited as a thin layer on this $SiO_2$ layer. In an actual instance, the process was controlled to produce a $SiO_2$ layer of 6,000-angstrom thickness and a lead layer of 300-angstrom thickness. Thereafter, first and second thermal oxidation process steps were carried out in accordance with the temperature schedule indicated in FIG. 3 and with the above described example.

The glass-like film so produced was found to be a glass-like layer in which only its surface part contained PbO below which the $SiO_2$ layer remained in its deposited form, and the thickness of the film was approximately 7,000 angstroms.

This method of depositing lead by evaporation onto an oxide layer covering the surface of a semiconductor is applicable not only to a substrate of germanium but also a substrate of silicon or various other kinds of semiconductors such as intermetallic compound semiconductors. Moreover, since the substrate does not become an oxide material, interfaces between the semiconductor and the covering film do not shift. Furthermore, by suitably selecting the temperature in the deposition of the $SiO_2$ layer, rediffusion at the time of formation of the covering film of impurities previously introduced can be prevented. In this respect, it is not desirable to raise the temperature above 700 degrees C. in the case of germanium.

In the procedure of the above example, the quantity of the $SiO_2$ to be deposited beforehand is reduced, and the quantity of the lead to be deposited is increased. For example, $SiO_2$ is deposited to a thickness of 3,000 angstroms, and lead is deposited by evaporation to a thickness of 1,000 angstroms, and, after the lead has been oxidized to PbO by the above described method, the element is heat treated in an oxidizing atmosphere. As a result, the previously deposited $SiO_2$ completely reacts with the PbO to form a lead glass-like substance. Moreover, the semiconductor surface is caused by the PbO to undergo accelerated oxidation, and the oxide of the semiconductor so formed reacts with the PbO to form a lead glass-like substance, whereby a glass-like covering film is formed.

Since an etched state of the semiconductor surface can be obtained at the same time as the forming of the glass film by this method, this method can be effectively applied in the case where the semiconductor surface is contaminated or in the case where thermal strains or working strains are remaining in the surface. However, since the substrate semiconductor oxidizes and becomes a material of the glass film, we have been unable to produce excellent glass films with semiconductors other than silicon, that is, with semiconductors such as germanium. In the case of a silicon substrate, excellent results can be obtained since the oxide obtained is $SiO_2$.

In the above-mentioned example, the method of preparing a covering film of $SiO_2$ onto a semiconductor substrate at a temperature lower than the temperature at which rediffusion of impurities does not occur has been described in connection with the case of utilizing pyrolytic decomposition of an organo-oxysilane. However, other various methods such as the following methods may be applied to the present invention.

(a) Method of utilizing vacuum evaporation.

(b) Method of subjecting an organic compound of Si to electro-discharge decomposition.

(c) Method of subjecting a silicon substrate to a heat treatment in a steam atmosphere of high pressure, for example, 700 mm. Hg. at a temperature of 600° C. and oxidizing said substrate, thereby to produce $SiO_2$.

When only the surface part of the $SiO_2$ layer which is deposited according to only one of the above-mentioned methods is subjected to vitrification by use of PbO, it is desirable that transferable metal or unstable oxide such as Si or $SiO_2$ does not exist in the remained $SiO_2$ layer.

Since the method of the present invention affords formation with low temperatures of protective films, it is highly suitable for forming protective films on the surfaces of semiconductors of devices such as transistors, diodes, and integrated circuits, and the lead glass film produced in each case is even and uniform, whereby the film is highly effective in shielding the semiconductor surface from harmful impurities and moisture contained in the surrounding atmosphere.

Furthermore, the effect of the film so produced to cause the regions in the vicinity of the semiconductor surface so covered to assume n-type conductivity, as a silicon dioxide film does, is weak. Accordingly, the surface leakage current can be reduced, and the breakdown voltage can be increased.

A further advantageous feature of the invention is that, since the lead is first oxidized completely to form lead monoxide, which is then caused to react with $SiO_2$, there is no possibility of lead remaining in the glass-like mixture film, whereby there is no occurrence of effects such as residual lead moving to the semiconductor surface during long use of the element to cause deterioration of the electrical characteristics of the element. Accordingly, the present invention makes possible the production of semiconductor elements of extremely high reliability.

It should be understood, of course, that the foregoing disclosure relates only to a preferred embodiment of the invention and that it is intended to cover all changes and modifications of the examples of the invention herein chosen for the purposes of the disclosure, which do not constitute departures from the spirit an scope of the invention as set forth in the appended claims.

What we claim is:

1. A method for surface treatment of semiconductors comprising the process steps of:
(a) preparing a silicon dioxide layer on the surface of a semiconductor substrate;
(b) depositing a lead layer on said silicon dioxide layer;
(c) subjecting said substrate to a first heat treatment in an oxidizing atmosphere at a temperature below 400° C. to convert said lead completely into a lead oxide; and thereafter
(d) subjecting said substrate to a second heat treatment in an oxidizing atmosphere at a temperature above 500° C. to cause reaction between said lead oxide and said silicon dioxide, thereby to form a glass-like covering containing lead oxide on the surface of said substrate.

2. A method for surface treatment of semiconductors comprising the process steps of:
(a) preparing a silicon dioxide layer on the surface of a semiconductor substrate;
(b) depositing a thin lead layer on said silicon dioxide layer;
(c) subjecting said substrate to a first heat treatment in an oxidizing atmosphere at a temperature below 400° C. to convert said lead completely into a lead oxide; and thereafter
(d) carrying out a second heat treatment after raising the treatment temperature to a temperature above 500° C., thereby to cause only the surface part of said silicon dioxide layer to react with said lead oxide to form a glass-like covering.

3. The method for surface treatment of semiconductors as claimed in claim 2, wherein the substrate semiconductor is silicon.

4. The method for surface treatment of semiconductors as claimed in claim 2, wherein the substrate semiconductor is germanium.

5. A method for surface treatment of semiconductors comprising the process steps of:
(a) preparing a silicon dioxide layer on the surface of a semiconductor substrate;
(b) depositing a thick layer on said silicon dioxide layer;
(c) subjecting said substrate to a first heat treatment in an oxidizing atmosphere at a temperature below 400° C. to convert said lead completely into a lead oxide; and thereafter
(d) carrying out a second heat treatment in an oxidizing atmosphere after raising the treatment temperature to a temperature above 500° C. to cause complete reaction of all of said silicon dioxide with said lead oxide, accelerated oxidation of said semiconductor substrate surface due to said lead oxide, and, at the same time, reaction of the resulting oxide of the semiconductor with said lead oxide, thereby to form a glass covering on the surface of the semiconductor substrate.

6. The method for surface treatment of semiconductors as claimed in claim 5, wherein the substrate semiconductor is silicon.

7. A method for surface treatment of semiconductors comprising the process steps of:
(a) depositing a silicon dioxide layer on the surface of a semiconductor substrate by pyrolytic decomposition of an organo-oxysilane;
(b) depositing a lead layer on said silicon oxide layer;
(c) heat treating said substrate in an oxidizing atmosphere at a first temperature below 400° C. to convert said lead completely into a lead oxide; and thereafter
(d) further heat treating said substrate in an oxidizing atmosphere at a second temperature above 500° C., thereby to form a glass-like covering containing lead oxide on the surface of said substrate.

References Cited

UNITED STATES PATENTS

| | | | |
|---|---|---|---|
| 3,300,339 | 1/1967 | Perri et al. | 117—201 |
| 3,301,706 | 1/1967 | Flaschen et al. | 117—217 |
| 3,313,661 | 4/1967 | Blake | 117—200 X |

WILLIAM L. JARVIS, *Primary Examiner.*

U.S. Cl. X.R.

117—106, 118, 135.1; 148—6.3

PO-1050
(5/69)

UNITED STATES PATENT OFFICE

CERTIFICATE OF CORRECTION

Patent No. 3,447,958 Dated June 3, 1969

Inventor(s) Shinkichi Okutsu et al.

It is certified that error appears in the above-identified patent and that said Letters Patent are hereby corrected as shown below:

Claim 5, line 5: After "thick" insert -- lead -- .

SIGNED AND
SEALED
JAN 20 1970

(SEAL)
Attest:

Edward M. Fletcher, Jr.
Attesting Officer

WILLIAM E. SCHUYLER, JR.
Commissioner of Patents